(12) United States Patent
Strader et al.

(10) Patent No.: US 10,477,738 B2
(45) Date of Patent: Nov. 12, 2019

(54) BOARD LEVEL SHIELDS AND SYSTEMS AND METHODS OF APPLYING BOARD LEVEL SHIELDING

(71) Applicant: Laird Technologies, Inc., Earth City, MO (US)

(72) Inventors: Jason L. Strader, Cleveland, OH (US); Eugene Anthony Pruss, Avon Lake, OH (US); Gerald R. English, Glen Ellyn, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 15/912,067

(22) Filed: Mar. 5, 2018

(65) Prior Publication Data
US 2018/0255666 A1    Sep. 6, 2018

Related U.S. Application Data

(60) Provisional application No. 62/467,440, filed on Mar. 6, 2017.

(51) Int. Cl.
| H05K 9/00 | (2006.01) |
| H05K 1/03 | (2006.01) |
| H05K 3/32 | (2006.01) |
| H05K 3/46 | (2006.01) |
| B32B 37/20 | (2006.01) |

(52) U.S. Cl.
CPC ......... *H05K 9/0024* (2013.01); *H05K 1/0393* (2013.01); *H05K 3/321* (2013.01); *H05K 3/4655* (2013.01); *H05K 3/4658* (2013.01); *H05K 3/4691* (2013.01); *H05K 9/0084* (2013.01); *B32B 37/206* (2013.01); *B32B 2309/02* (2013.01); *B32B 2309/12* (2013.01); *H05K 2201/0195* (2013.01); *H05K 2201/0715* (2013.01)

(58) Field of Classification Search
CPC .......... H05K 9/003; H05K 9/0084; H05K 2201/0715; H05K 9/0024
See application file for complete search history.

(56) References Cited

U.S. PATENT DOCUMENTS

| 6,485,595 B1 | 11/2002 | Yenni, Jr. et al. |
| 6,596,937 B2 | 7/2003 | Mazurkiewicz |

(Continued)

OTHER PUBLICATIONS

EMI Shielding Film for High-Speed Transmission FPC, SF-PC3100-C, www.tatsuta.com, accessed Mar. 1, 2017, 1 page.

(Continued)

*Primary Examiner* — Hung V Ngo
(74) *Attorney, Agent, or Firm* — Harness, Dickey & Pierce, P.L.C.; Anthony G. Fussner

(57) ABSTRACT

A multilayer board level shield includes an electrically-conductive shielding layer disposed between inner and outer dielectric layers. The multilayer board level shield may have an overall thickness of about 25 microns or less. The multilayer board level shield may have sufficient flexibility to be reconfigurable generally over one or more components on a substrate to thereby provide board level shielding for the one or more components. One or more dielectric joints may be defined between the printed circuit board and the outer dielectric layer that attach the multilayer board level shield to the printed circuit board.

20 Claims, 7 Drawing Sheets

(56) References Cited

U.S. PATENT DOCUMENTS

| | | | |
|---|---|---|---|
| 6,768,654 B2* | 7/2004 | Arnold | B29C 45/14811 |
| | | | 174/394 |
| 7,351,479 B2 | 4/2008 | Funkenbusch et al. | |
| 8,004,860 B2 | 8/2011 | Salzman | |
| 8,716,606 B2 | 5/2014 | Kelley et al. | |
| 8,847,184 B2 | 9/2014 | Cheng et al. | |
| 8,853,562 B2 | 10/2014 | Izawa et al. | |
| 8,969,737 B2 | 3/2015 | Just et al. | |
| 2007/0264496 A1 | 11/2007 | Arnold | |
| 2010/0214713 A1 | 8/2010 | Song | |
| 2015/0250080 A1 | 9/2015 | Haruna et al. | |
| 2015/0282394 A1* | 10/2015 | Yumi | H05K 1/181 |
| | | | 174/377 |
| 2017/0290207 A1* | 10/2017 | Smith | H05K 9/003 |
| 2018/0009072 A1 | 1/2018 | Kittel et al. | |

OTHER PUBLICATIONS

EMI/RFI Shielding Gaskets and Solutions/Holland Shielding Systems BV, Search EMI Shielding Products, http://hollandshielding.com/Search-rfi%20shield%20tape, accessed Mar. 1, 2017, 3 pages.
Cable Management and Shileding—Jolex, https://www.jolex.se/en/cable-management-and-shielding/, Copyright 2017, 3 pages.
Toyochem, Counterfeit Product Warning, Feb. 3, 2015, 1 page.

* cited by examiner

BOARD LEVEL SHIELDS AND SYSTEMS AND METHODS OF APPLYING BOARD LEVEL SHIELDING

CROSS-REFERENCE TO RELATED APPLICATION

This application claims priority to and the benefit of U.S. Provisional Patent Application No. 62/467,440 filed Mar. 6, 2017. The entire disclosure of the above application is incorporated herein by reference.

FIELD

The present disclosure generally relates to board level shields.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

DETAILED DESCRIPTION

Figure 1:
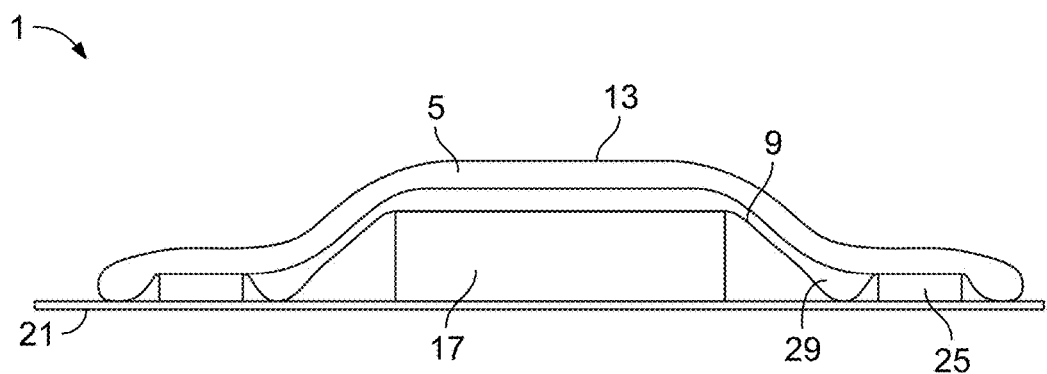
FIG. 1 illustrates an exemplary embodiment of a multilayer thin film board level shield (BLS) including an electrically-conductive shielding layer (e.g., a metal layer, metallization, metal coating, metal foil, etc.) disposed between (e.g., pattern coated onto either or both of an, etc.) inner and outer dielectric layers (e.g., plastic layers, thin polymer films, etc.).

Example embodiments will now be described more fully with reference to the accompanying drawings.

Portable electronics are becoming smaller, thinner, and highly densely populated with components making space in all directions in a device more limited and more valuable. Thus, there is a need to reduce the x, y and z footprint of board level shields as well as a need to reduce the weight of board level shields. This need is of particular interest for wearable electronics manufacturers (e.g., smart watches, etc.) as it is difficult to provide adequate electromagnetic interference (EMI) shielding that is very thin and with a reduced XY footprint and weight.

Accordingly, disclosed herein are exemplary embodiments of multilayer thin film board level shields that may be very thin, lightweight, and provide good EMI shielding. Exemplary embodiments may include various types of plastics or other dielectric materials (e.g., liquid crystal polymer (LCP), polyetheretherketone (PEEK), polyimide (PI), polyethylene terephthalate (PET), polypropylene (PP), polyethylene (PE), other polymer films, other high temperature films, films capable of withstanding soldering without shrinking, etc.) that are provided (e.g., pattern coated, etc.) with electrically-conductive shielding material (e.g., metal, etc.). The electrically-conductive shielding material may also be provided or coated with dielectric material. The multilayer thin film board level shields may be directly applied to PCB components to provide EMI board level shielding (e.g., shielding effectiveness of 10 decibels (dB), 20 dB, 30 dB, 40 dB, more than 40 dB, less than 10 dB, between 10 dB and 40 dB, etc.) in a very thin package (e.g., 15 microns thick or less, etc.).

By way of example, a multilayer thin film BLS may be attached directly to the PCB ground without requiring bond pads and/or a BLS fence or frame. The multilayer thin film BLS may be attached directly to the PCB ground traces or ground ring by laser welding, sonic welding, melting, electrically-conductive adhesive, via a hot stamping method, via a tamping and cutting method, by pressing under heat, pressure, and time, etc.

To be more robust for some applications, the layered structure of the multilayer thin film BLS may have a thickness of at least about 20 to 25 microns.

In exemplary embodiments, the material stackup (e.g., laminated structure, etc.) of the multilayer thin film board level shields may be made roll to roll in a wide sheet that is used as a sheet or slit into rolls allowing for an easier roll to roll process.

In exemplary embodiments, a multilayer thin film BLS includes a dielectric layer and a metal coating thereon, where the metal coating has a minimum thickness (e.g., 10 microns, 15 microns, 20 microns, 25 microns, etc.) to provide a certain level of shielding effectiveness with a frequency bandwidth, such as a frequency bandwidth from about 50 megahertz (MHz) to about 6 gigahertz (GHz), a frequency bandwidth up to about 90 or 100 GHz, the frequency bandwidth for the $5^{th}$ generation wireless system (5G), etc. The dielectric layer may have a minimum thickness sufficient to provide electric isolation needed by a particular application.

For example, an exemplary embodiment of a multilayer thin film BLS includes a dielectric material having a metal coating with a minimum thickness of 10 microns to provide a shielding effectiveness of at least 40 decibels (dB) from about 50 megahertz (MHz) to about 6 gigahertz (GHz). In other exemplary embodiments, the metal coating may have a different thickness (e.g., only about 4 microns, etc.) if a lower shielding effectiveness (e.g., 10 dB, 20 dB, etc.) would be sufficient for the frequency bandwidth.

In exemplary embodiments of the multilayer thin film board level shields, various dielectric materials may be used such as plastics, liquid crystal polymer (LCP), polyetheretherketone (PEEK), polyimide (PI), polyethylene terephthalate (PET), polypropylene (PP), polyethylene (PE), other polymer films, other high temperature films, films capable of withstanding soldering without shrinking, etc. In exemplary embodiments, plastics having heat shrink, crosslinking, and/or melting properties may be used depending on the needs of the end use or installation.

In alternative exemplary embodiments, a metal foil may be used and pattern coated with dielectric material(s) (e.g., plastic, other dielectric materials including those disclosed herein, etc.) where needed in order to provide shielding effectiveness and electric isolation where needed. Other exemplary materials that may be used in reinforced foil, poly-foil (e.g., metal foil laminated to polyester or polyethylene terephthalate (PET), polypropylene (PP), polyethylene (PE), other polymers, etc.), metallized or metal plated polyimide film, electrically-conductive plastic film, other electrically-conductive films, other foils, other electrically-conductive material layers, etc.

In exemplary embodiments, a multilayer thin film shield may be attached to the PCB directly to the ground ring requiring no bond pads or BLS fence. A dielectric layer or portion may be coated or otherwise provided where needed to provide electrical isolation such as when the electrically-conductive layer or portion of the BLS has been snugly fit (e.g., by pressing, heat shrinking, deforming, flexing, etc.) onto and around the PCB component.

A multilayer thin film BLS may be attached to a PCB in various ways. For example, the attachment method may be any method that provides an adequate reliable bond of the BLS to the PCB such that the electrically-conductive portion of the BLS is in electrical contact with the ground of the PCB. Some exemplary methods for attaching the multilayer thin film BLS to a PCB include laser welding, sonic welding, melting the dielectric material, using an electrically-conductive adhesive, soldering, etc.

For example, an exemplary method includes laser welding the plastic or other dielectric material of the BLS to the board of the PCB. This exemplary method may also include laser welding the electrically-conductive portion (e.g., metal foil, metal coating on the dielectric material, etc.) of the BLS to the PCB ground trace. In another exemplary embodiment, the laser welding of the BLS plastic or other dielectric material to the PCB may be sufficient such that laser welding of the BLS electrically-conductive portion to the PCB ground trace is not necessary. In this latter example, the laser welding of the BLS plastic may be performed both inside and outside of the ground trace to ensure good adhesion and electrical contact between the ground trace and the electrically-conductive portion of the BLS. A jig may be used to hold the layered structure or multilayer thin film BLS down and thereby retain the positioning of the multilayer thin film BLS relative to the PCB. The jig may have one or more openings to allow the laser to complete the weld while the layered structure is held in place relative to the PCB.

Another exemplary method includes sonic welding the plastic or other dielectric material of the BLS to the board of the PCB. In this example, the sonic welder may be the same jig that is used to the hold the layered structure or multilayer thin film BLS down and retain its positioning relative to the PCB. This method may also include sonic welding the electrically-conductive portion (e.g., metal foil, metal coating on the dielectric material, etc.) of the BLS to the PCB ground. This sonic welding of the BLS plastic or other dielectric material to the PCB and sonic welding of the BLS electrically-conductive portion to the PCB ground may be performed simultaneously. In another exemplary embodiment, the sonic welding of the BLS plastic or other dielectric material to the PCB may be sufficient such that sonic welding of the BLS electrically-conductive portion to the PCB ground is not necessary.

A further exemplary method includes melting the plastic or other dielectric material of the BLS and using the melted plastic as an adhesive to bond the BLS to the PCB and to electrically-contact the electrically-conductive portion (e.g., metal foil, metal coating on the dielectric material, etc.) of the BLS to the PCB ground.

In some exemplary embodiments, a multilayer thin film BLS includes a heat shrink film. The heat shrink film may be used for attaching the BLS to the PCB. The heat shrink film may also advantageously further reduce the BLS size and needed space for the BLS.

In exemplary embodiments, a multilayer thin film board level shield (BLS) may include one or more electrically-conductive foils or films, such as metal plated polyimide film, other metallized or metal plated film, other electrically-conductive films, metal foil, reinforced foil, poly-foil (e.g., metal foil laminated to polyester or polyethylene terephthalate (PET), polypropylene (PP), polyethylene (PE), other polymer, etc.), other foils, etc. For example, the multilayer thin film BLS may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. The multilayer thin film BLS may include a dielectric layer that provides electrical insulation to inhibit the BLS from electrically shorting any components received under the BLS.

In exemplary embodiments, the multilayer thin film BLS may comprise a multilayer structure having more than one foil. In other exemplary embodiments of the BLS, an electrically-conductive fabric may be used as the electrically-conductive shielding layer in the place of the foil(s).

The multilayer thin film BLS may include one or more materials (e.g., polyimide (PI), other high temperature polymer, etc.) suitable for withstanding (e.g., without significant deformation or shrinkage, etc.) a reflow soldering process if used to install the BLS to a PCB. The multilayer thin film BLS may comprise a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the BLS is able to withstand solder reflow (e.g., withstand reflow temperatures of 250 degrees Celsius and a cycle time of nine minutes, etc.). Other embodiments may include different foils, different films, and/or electrically-conductive materials.

Accordingly, exemplary embodiments may provide one or more (but not necessarily any or all) of the following features or advantages, such as reduced space needed for the BLS, reduced weight of the BLS, lower cost for the BLS, a faster process for installation or application of the BLS to a PCB, and/or a less complicated design and manufacturing process for the BLS, etc.

Figure 2:
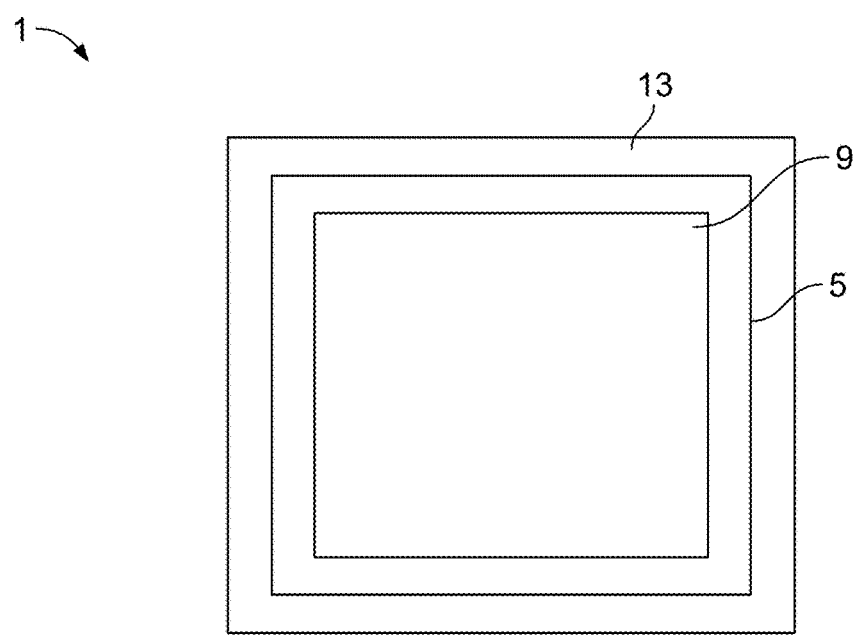
FIG. 2 illustrates the multilayer thin film BLS shown in FIG. 1 according to an exemplary embodiment that includes inner and outer plastic dielectric layers and a metal layer disposed on (e.g., metallized or pattern coated onto, etc.) the outer plastic dielectric layer and/or sandwiched generally between the inner and outer plastic dielectric layers.

With reference to the figures, FIGS. 1 and 2 illustrate an exemplary embodiment of a multilayer thin film board level shield (BLS) 1 according to aspects of the present disclosure. The multilayer thin film BLS includes an electrically-conductive shielding layer 5 (e.g., a metal layer, metallization, metal coating, metal foil, etc.) disposed between (e.g., pattern coated onto either or both of an, etc.) inner and outer dielectric layers 9 and 13 (e.g., plastic layers, thin polymer films, etc.).

The multilayer thin film BLS 1 is shown disposed (e.g., draped, flexed, wrapped, etc.) over a device or component 17 on a printed circuit board (PCB) 21. The multilayer thin film BLS 1 may be attached directly to the PCB ground without requiring bond pads and/or a BLS fence or frame. By way of example, the multilayer thin film BLS 1 may be attached directly to the PCB ground traces or ground ring 25 by laser welding, sonic welding, melting, electrically-conductive adhesive, via a hot stamping method, via a tamping and cutting method, by pressing under heat, pressure, and time, etc.

As shown in FIG. 1, there may be essentially no gap or substantially zero gap between the top of the PCB component 17 and the BLS 1, thereby reducing the overall combined height of the PCB 21 and BLS 1. By way of example, the multilayer thin film BLS 1 may have an overall combined thickness of about 25 microns or less, and the electrically-conductive shielding (e.g., metal, etc.) layer 5 may have a thickness of about 10 microns or less.

In some exemplary embodiments, the dielectric layer(s) 9 and/or 13 may be heated and melted such that the melted dielectric layer(s) 29 is usable as an adhesive. The melted dielectric material 29 after solidifying or hardening may then bond the multilayer thin film BLS 1 to the PCB 21. Alternatively, other methods may be used for applying the multilayer thin film BLS including other methods that include pressing the materials under heat, pressure, and time, etc.

As shown in FIG. 2, the multilayer thin film BLS 1 includes inner and outer plastic dielectric layers 9 and 13 and a metal layer 5 disposed on (e.g., metallized or pattern coated onto, etc.) the outer plastic dielectric layer 13 and/or sandwiched generally between the inner and outer plastic dielectric layers 9 and 13. Although FIG. 2 illustrates the multilayer thin film BLS 1 having a rectangular shape, other exemplary embodiments may include a BLS having different configurations (e.g., circular, triangular, irregular, other non-rectangular shapes, etc.).

Figure 3:
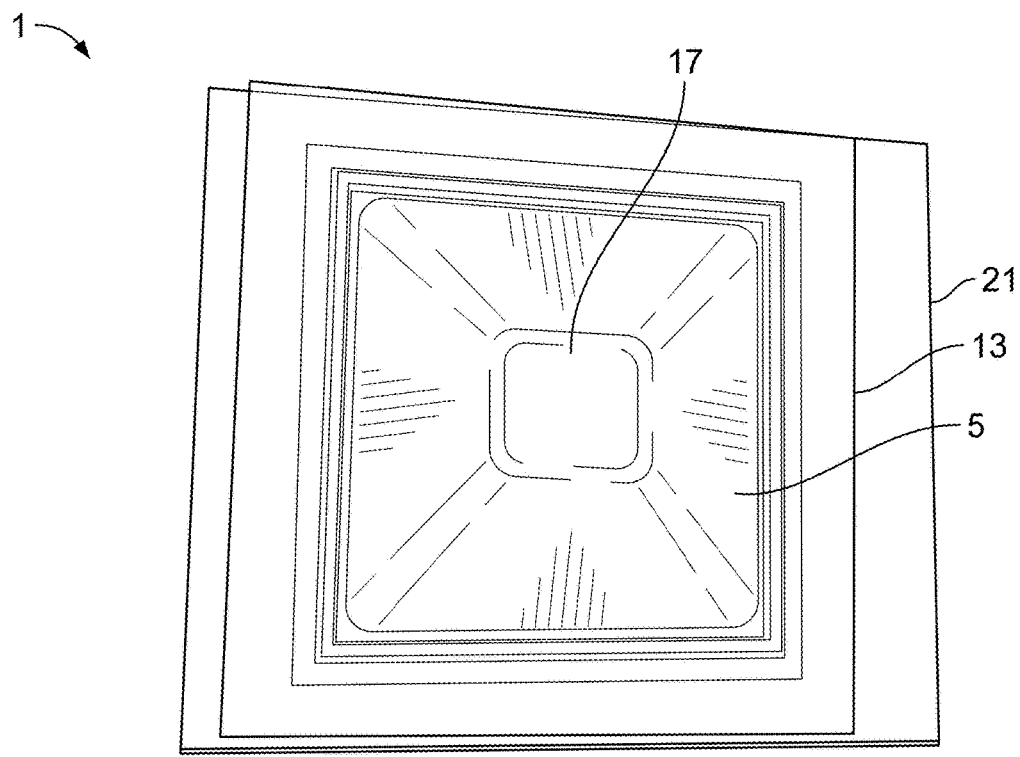
FIGS. 3 through 5 illustrate an exemplary prototype of a multilayer thin film board level shield (BLS) according to an exemplary embodiment that includes a copper layer disposed between inner and outer dielectric layers (e.g., polyethylene terephthalate (PET), plastic, other thin dielectric film, etc.).
Figure 4:
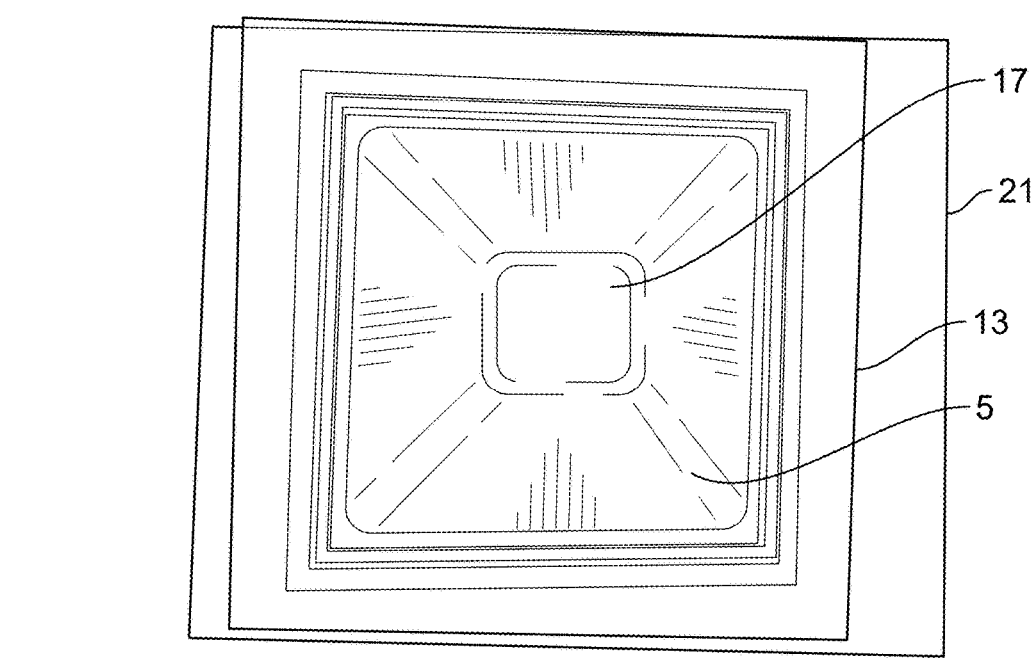
Figure 5:
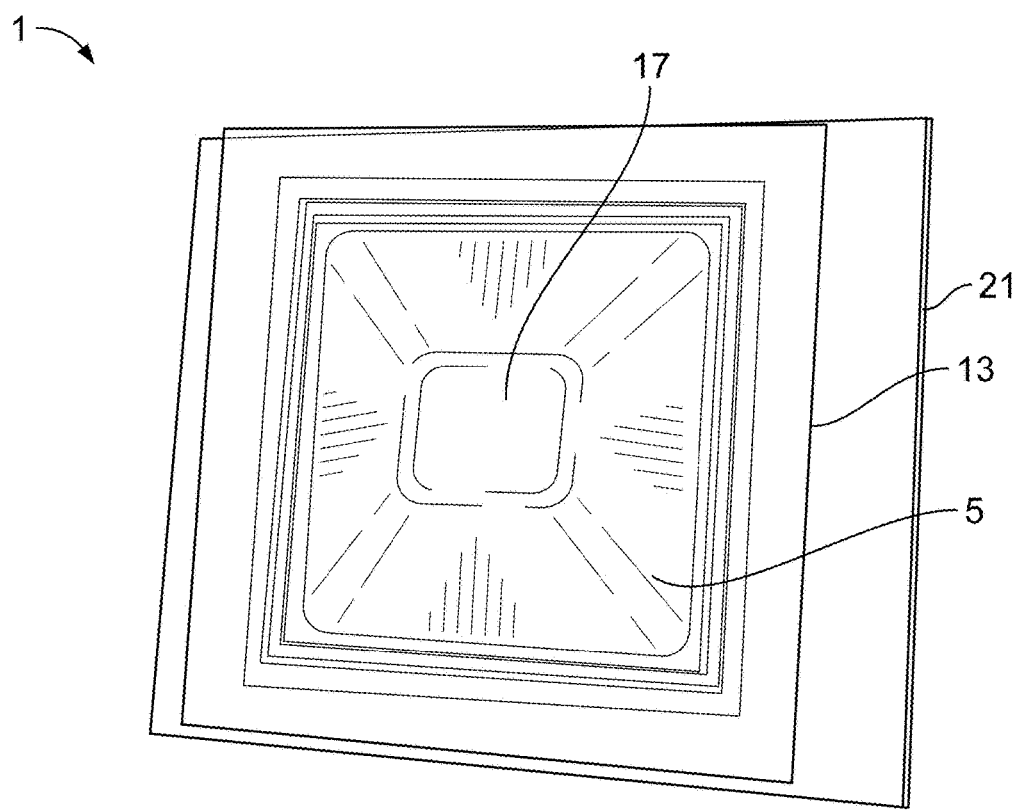

FIGS. 3 through 5 illustrate an exemplary prototype of the multilayer thin film board level shield (BLS) 1 according to an exemplary embodiment embodying one or more aspects of the present disclosure. As shown, the BLS 1 includes a copper layer 5 disposed between an inner dielectric layer and an outer dielectric layer 13 (e.g., polyethylene terephthalate (PET), plastic, other thin dielectric film, etc.).

The multilayer thin film BLS 1 is disposed (e.g., draped, flexed, wrapped, etc.) over a device or component 17 on a printed circuit board (PCB) 21. The multilayer thin film BLS 1 is attached directly to the PCB ground without requiring bond pads and/or a BLS fence or frame.

In this illustrated example, the copper layer 5, inner dielectric layer, and outer dielectric layer 13 were first assembled, coupled, or attached (e.g., adhesively attached, etc.) together. Then, the assembled layer stackup underwent heated stamping or a hot stamp method. During the hot stamping process, the outer dielectric layer 13 is stamped (e.g., cut from a roll, etc.). Also during the hot stamping process, the copper layer 5, inner dielectric layer, and outer dielectric layer are positioned relative to the PCB 21 such that the copper layer 5 is positioned generally over the PCB component 17 and electrically grounded to the PCB ground (e.g., PCB ground ring or traces 25 (FIG. 1), etc.) and such that portions of the dielectric layer (e.g., plastic, portions 29 (FIG. 1), etc.) are positioned against the PCB substrate or board 21.

During the hot stamping process, the copper layer 5 may be deformed, flexed, bent, etc. over and around the PCB component 17. This deforming or flexing may also position portions of the copper layer 5 against and in electrical contact with the PCB ground 25 (FIG. 1). Heating of the copper layer 5 during the hot stamping process may allow the copper layer 5 to be more easily deformed or flexed, although this heating may not be needed as the copper layer 5 may be thin enough to have sufficient flexibility.

The inner dielectric layer and outer dielectric layer 13 may also be heated and melted during the hot stamping such that the melted dielectric layer(s) 29 (FIG. 1) is usable as an adhesive. The melted dielectric material 29 after solidifying or hardening may then bond the multilayer thin film BLS 1 to the PCB 21. Alternatively, other methods may be used for applying the multilayer thin film BLS including other methods that include pressing the materials under heat, pressure, and time, etc.

In an alternative embodiment, a copper layer with an inner dielectric or electrically insulating layer thereon may first be positioned relative to the PCB, e.g., with the dielectric layer against the top of the PCB component, etc. Then, an outer dielectric layer (e.g., plastic, etc.) may be applied over the copper layer and PCB by using a heated stamping or hot stamp method. During the hot stamping process, the outer dielectric layer may be stamped (e.g., cut from a roll, etc.) and positioned relative to the PCB, such that the outer dielectric layer is positioned over the pre-existing copper layer and portions of the outer dielectric layer are positioned against the PCB substrate or board. During the hot stamping process, the copper layer may be deformed, flexed, bent, etc. over and around the PCB component. This deforming or flexing may also position portions of the copper layer against and in electrical contact with the PCB ground. Heating of the copper layer during the hot stamping process may allow the copper layer to be more easily deformed or flexed, although this may not be needed as the copper layer may be thin enough to have sufficient flexibility. The dielectric layer(s) may be heated and melted during the hot stamping process such that the melted dielectric layer(s) is usable as an adhesive. The melted dielectric material after solidifying or hardening may then bond the multilayer thin film BLS to the PCB. Alternatively, other methods may be used for applying the multilayer thin film BLS including other methods that include pressing the materials under heat, pressure, and time, etc.

Figure 6:
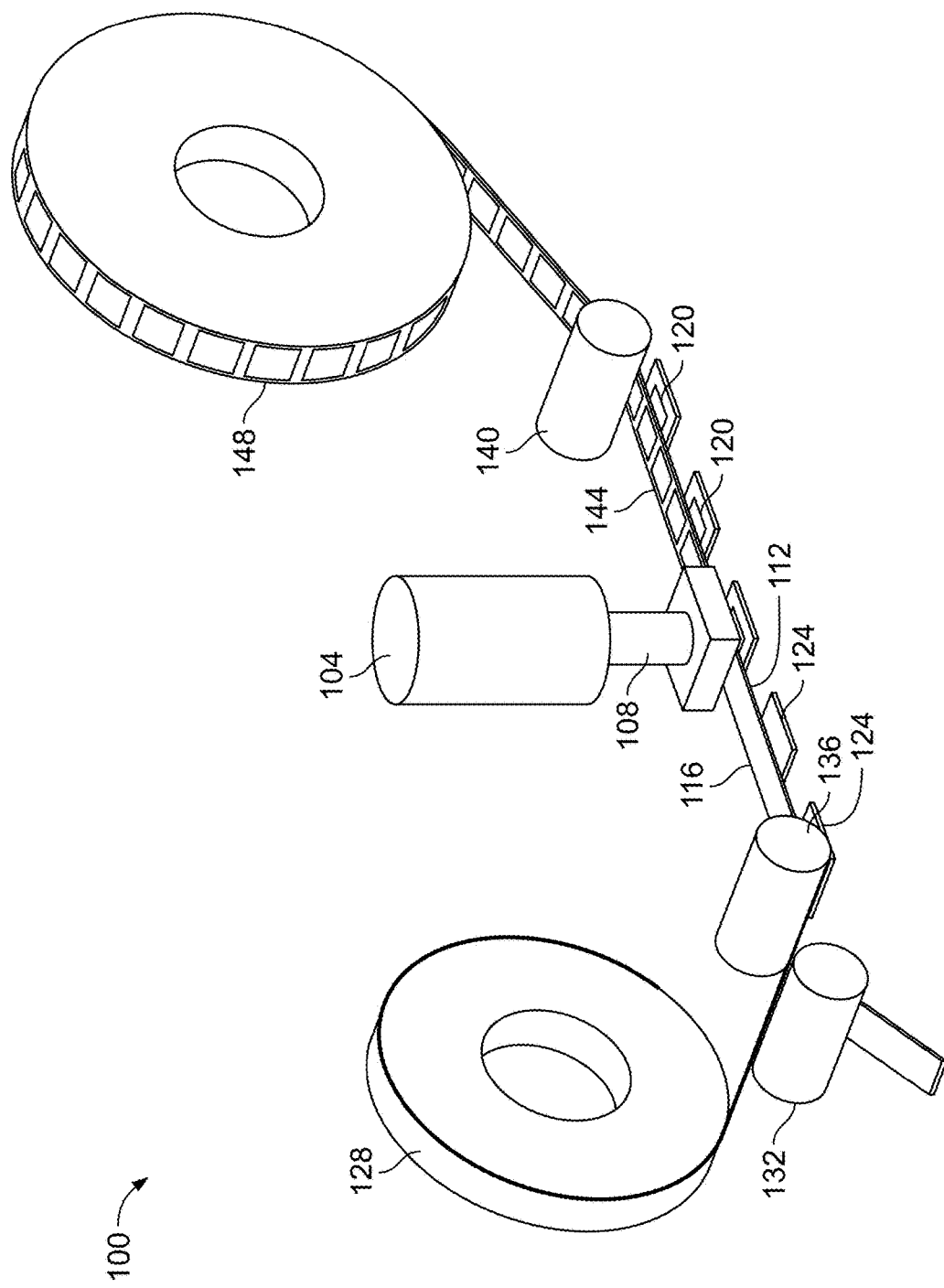
FIG. 6 illustrates an exemplary system for applying (e.g., tamping and cutting, etc.) multilayer thin film board level shields (e.g., copper layer along a dielectric layer, etc.) to PCBs according to an exemplary embodiment.

FIG. 6 illustrates an exemplary system 100 for applying (e.g., tamping and cutting in a roll-to-roll or reel-to-reel process, etc.) board level shielding (e.g., multilayer thin film board level shields 120, etc.) to printed circuit boards (PCBs) 124 according to an exemplary embodiment embodying one or more aspects of the present disclosure. Although FIG. 6 shows the multilayer thin film board level shields 120 being applied to PCBs 124, the system 100 may also be used for applying board level shielding to a wide range of other components and substrates. Accordingly, aspects of the present disclosure should not be limited to use with only PCBs and should not be limited to any specific location or portion of a PCB.

As shown in FIG. 6, the system 100 includes a press 104 coupled with a die 108. In operation, the press 104 and die 108 are operable for tamping and cutting a portion of the strip 112 that includes dielectric material and electrically-conductive material for the respective dielectric layer(s) and electrically-conductive shielding layer of the multilayer thin film BLS 120 that is underneath the die 108.

By way of example, the die 108 may comprise a sharp knife die. Additionally, the system 100 may include sonication, laser, and/or hot melt features. For example, the system 100 may be configured with the ability to heat so that the system 100 is usable to solder or melt the plastic (or other dielectric) for attachment of the BLS 120 to the PCB 124. The system 100 may be configured to allow the base or the head to sonically vibrate for attachment and/or include a laser for welding while the part is held in place.

In this example, the die 108 may tamp the multilayer thin film BLS 120 downward onto a corresponding one of the PCBs 124 located underneath the die 108. Then, the sharp knife die may be used to cut the multilayer thin film BLS 120 through the strip 112, e.g., without having to completely or entirely sever the strip 112 to make the cut, etc. During this cutting operation, the electrically-conductive shielding layer and dielectric layer(s) of the multilayer thin film BLS 120 may be pressed downwardly onto the PCB 124. The outer dielectric layer 116 may be pushed through the electrically-conductive layer with the die 108, which causes severing of the outer dielectric layer 116 and electrically-conductive shielding layer of the multilayer thin film BLS 120 from the strip 112.

As shown in FIG. 6, the multilayer thin film BLS 120 may remain on the PCB 124 when the die 108 is removed and the next portion of the strip 112 and the next PCB 124 is moved into place under the die 108. By way of example, the PCBs 124 may progress or move relative to the die 108 via a conveyor belt or other feeding/conveyor mechanism.

In this illustrated embodiment, the strip of material 112 that includes the dielectric and electrically-conductive materials of the multilayer thin film BLS 120 is roll stock from a supply or roll 128. Rollers 132, 136, 140 are used to cause the strip of material 112 to unroll from the supply 124 of roll stock and travel to the location underneath the die 108 for tamping and cutting. After the multilayer thin film board level shields 120 have been tamped, cut, and applied to the PCBs 124, what is left of the strip of material 144 is collected or wound onto the salvage roll 148. In other embodiments, more or less rollers may be used and/or strips of material that do not come on rolls may be used. In which case, the strips of material may be put in place by hand, with a jig, or by an automated means.

In an exemplary embodiment, the system 100 preferably uses as much of the strip of material as possible to thereby minimize or at least reduce waste during the application process. As shown in FIG. 2, the PCBs 124 are spaced apart by a greater distance than which the strip 112 is advanced after each tamping and cutting operation. After each tamping and cutting operation, the strip 112 is advanced only enough (e.g., a minimum distance, etc.) to allow the next portion of the strip 112 to be tamped and cut in order to apply the multilayer thin film BLS 120 to the next PCB 124.

In an exemplary embodiment, the die 108 is configured to cut the strip 112 such that the cut portion of the dielectric material for the dielectric layer 116 is wider than the electrically-conductive shielding layer of the multilayer thin film BLS 120. This allows the electrically-conductive shielding layer of the multilayer thin film BLS 120 to be positioned over a component or device on the PCB 124 while also allowing portions of the dielectric layer 116 to be positioned relative to (e.g., in direct contact against, etc.) the board of the PCB 124 for attachment thereto. For example, the system 100 may include one or more heaters for applying heat to melt portions of the dielectric layer 116. The melted portions may then be usable as or similar to an adhesive for attaching the multilayer thin film BLS 120 to the PCB 124. The heat may be applied or added to the top and/or heat may be applied or added to the base or bottom, etc.

Additionally, or alternatively, the system 100 may be configured with cooling added to the top part and die used to cut the TIM. A die may be added to the top plate in some exemplary embodiments. Advantageously, a stamping machine (hot and cold) may be able to tamp, cut, and apply multilayer thin film board level shields to PCBs as disclosed herein with only little or no modifications being needed to the stamping machine.

The roll or supply 128 may be provided in various sizing. The roll width may be selected based on the configuration of the PCBs 124 and multilayer thin film board level shields 120. The roll 128 may be placed onto an unwind and threaded through the application machine or system 100. The PCBs 124 and die 108 may be oriented in the application machine or system 100 to maximize usage of the materials. The PCBs 124 may be placed in a jig for application step to ensure good or perfect positioning and BLS placement. For low volumes, the orientation may be performed manually by hand although for high volumes the orientation may be performed automatically, e.g., by an automated table (e.g., turntable or other, etc.). The system 100 may include a sensor system to advance the rolled material for the next BLS application. Alternatively, the system 100 may be configured with a set distance advance process. Heat and cooling may be provided to improve application robustness.

In the above exemplary embodiment, the strip of material 112 included both the dielectric material and the electrically-conductive material for the respective dielectric and electrically-conductive shielding layers of the multilayer thin film board level shields 120. In an alternative embodiment, the strip of material 112 included the dielectric material used for the dielectric layer 116. The strip of material 112 did not include the electrically-conductive shielding layer. In this alternative embodiment, the electrically-conductive shielding layer may instead be pre-applied to the PCBs 124. Then, the press 104 and die 108 may be used for tamping and cutting the dielectric layer 116 from the strip of material 112 to thereby apply the dielectric layer 116.

In this example, a sharp knife die may be used to cut the dielectric layer 116 through the strip 112, e.g., without having to completely or entirely sever the strip 112 to make the cut, etc. During this cutting operation, the dielectric layer 116 may be pressed downwardly onto the electrically-conductive layer pre-applied onto the PCB 124. The die 108 is configured to cut the strip 112 such that the cut portion of the dielectric material for the dielectric layer 116 is wider than the electrically-conductive shielding layer of the multilayer thin film BLS 120. This allows portions of the dielectric layer 116 to be positioned relative to (e.g., in direct contact against, etc.) the board of the PCB 124 for attachment thereto. The system 100 may include one or more heaters for applying heat to melt portions of the dielectric layer 116. The melted portions may then be usable as or similar to an adhesive for attaching the multilayer thin film BLS 120 to the PCB 124. The heat may be applied or added to the top and/or heat may be applied or added to the base or bottom, etc.

Figure 7:
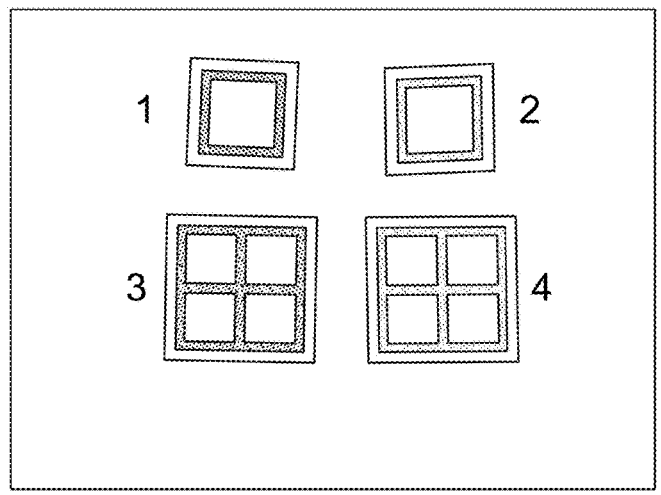
FIG. 7 illustrates exemplary prototypes of multilayer thin film board level shields according to exemplary embodiments that include a copper layer disposed between inner and outer dielectric layers (e.g., polyethylene terephthalate (PET), plastic, other thin dielectric film, etc.).

FIG. 7 illustrates four exemplary prototypes 1, 2, 3, and 4 of multilayer thin film board level shields according to exemplary embodiments. Examples 1 and 3 included copper disposed between inner and outer dielectric layers (e.g., polyethylene terephthalate (PET), plastic, other thin dielectric film, etc.). Examples 2 and 4 included solder disposed between inner and outer dielectric layers (e.g., polyethylene terephthalate (PET), plastic, other thin dielectric film, etc.). Examples 1 and 2 had dimensions of 30 millimeters (mm)× 30 mm, while examples 3 and 4 were 43 mm×43 mm. Examples 1 and 3 were used for hot press/ultrasonic welding testing, whereas examples 2 and 4 were used for soldering tests. The dimensions and materials disclosed in in this paragraph are examples that are provided for purpose of illustration only.

Figure 8:
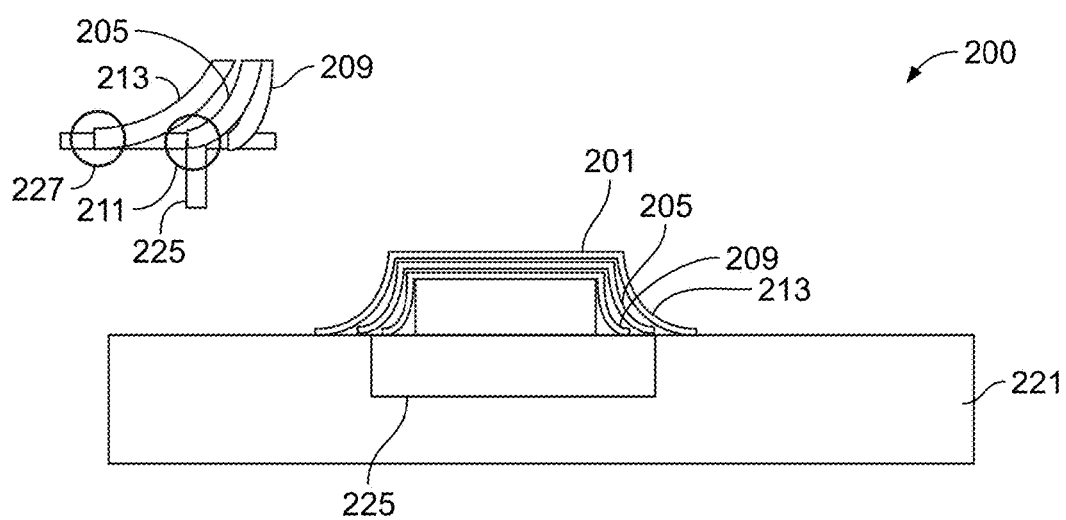
FIG. 8 illustrates a system in package (SiP) according to an exemplary embodiment that includes a multilayer flexible BLS comprising a copper foil sandwiched between two thermoplastic layers.

FIG. 8 illustrates a system in package (SiP) 200 according to an exemplary embodiment that includes a copper foil 205 sandwiched between two thermoplastic layers 209, 213. FIG. 8 also illustrates the copper to copper (Cu—Cu) contact 211 between the copper foil 205 and the copper ground plane 225 of the PCB 221. Also shown in FIG. 8 is the thermoplastic PCB joint 227 that attaches the BLS 201 to the PCB 221. In exemplary embodiments of the SiP 200, a hot stamp, sonic welding, laser welding, or soldering may be used to apply thin foil 205 (e.g., copper foil, etc.) as a BLS 201. Exemplary embodiments may allow roll-to-roll processing, BLS thickness as thin as 15 microns, low cost, pattern coating to support multi-cavity design, fast heat transfer due to thickness, and/or placement of TIM directly on top, etc.

Figure 9:
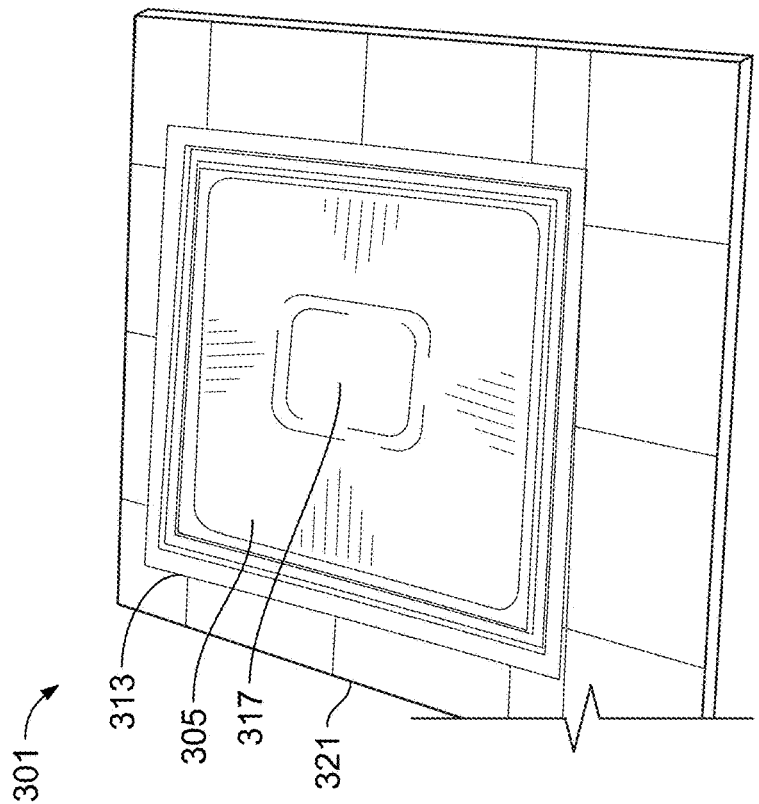
FIG. 9 illustrates exemplary prototypes of a SiP multilayer BLS according to exemplary embodiments.

FIG. 9 illustrates an exemplary prototype of a SiP multilayer BLS 301 according to an exemplary embodiment embodying one or more aspects of the present disclosure. As shown, the BLS 301 includes a copper layer 305 disposed between an inner dielectric layer and an outer dielectric layer 313 (e.g., polyethylene terephthalate (PET), plastic, other thin dielectric film, etc.).

Figure 10:
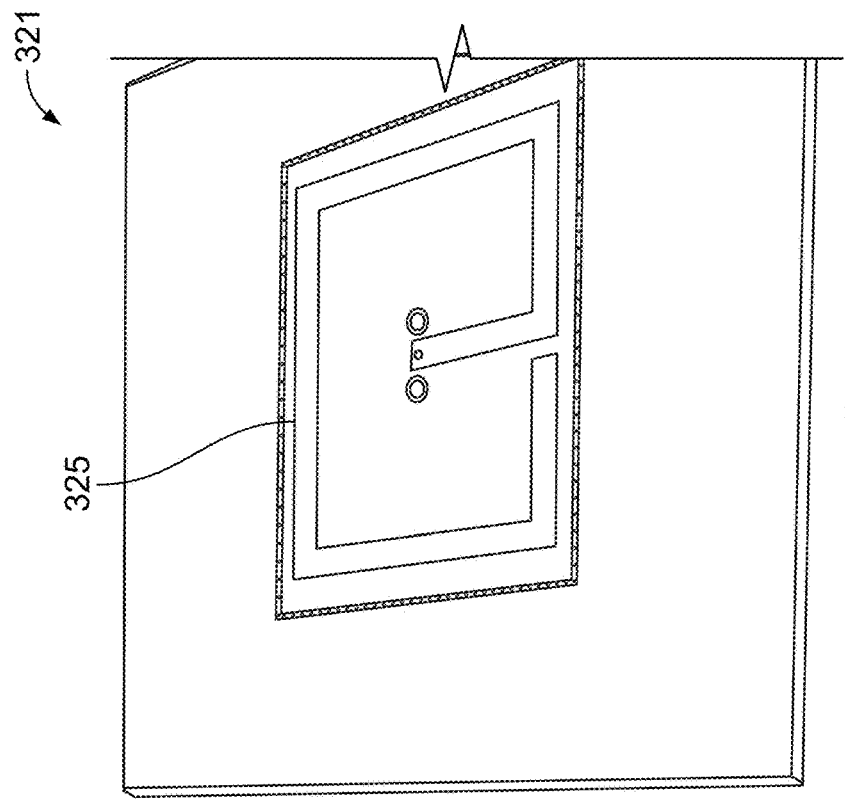
FIG. 10 illustrates the exemplary PCB ground traces or ground ring of the PCB shown in FIG. 9 without the multilayer BLS.

The multilayer thin film BLS 301 is disposed (e.g., draped, flexed, wrapped, etc.) over a device or component 317 on a printed circuit board (PCB) 321. The multilayer thin film BLS 301 may be attached directly to the PCB ground 325 (FIG. 10) without requiring bond pads and/or a BLS fence or frame. FIG. 10 illustrates the exemplary PCB ground traces or ground ring 325 of the PCB 321 shown in FIG. 9 without the multilayer BLS 301.

Figure 11:
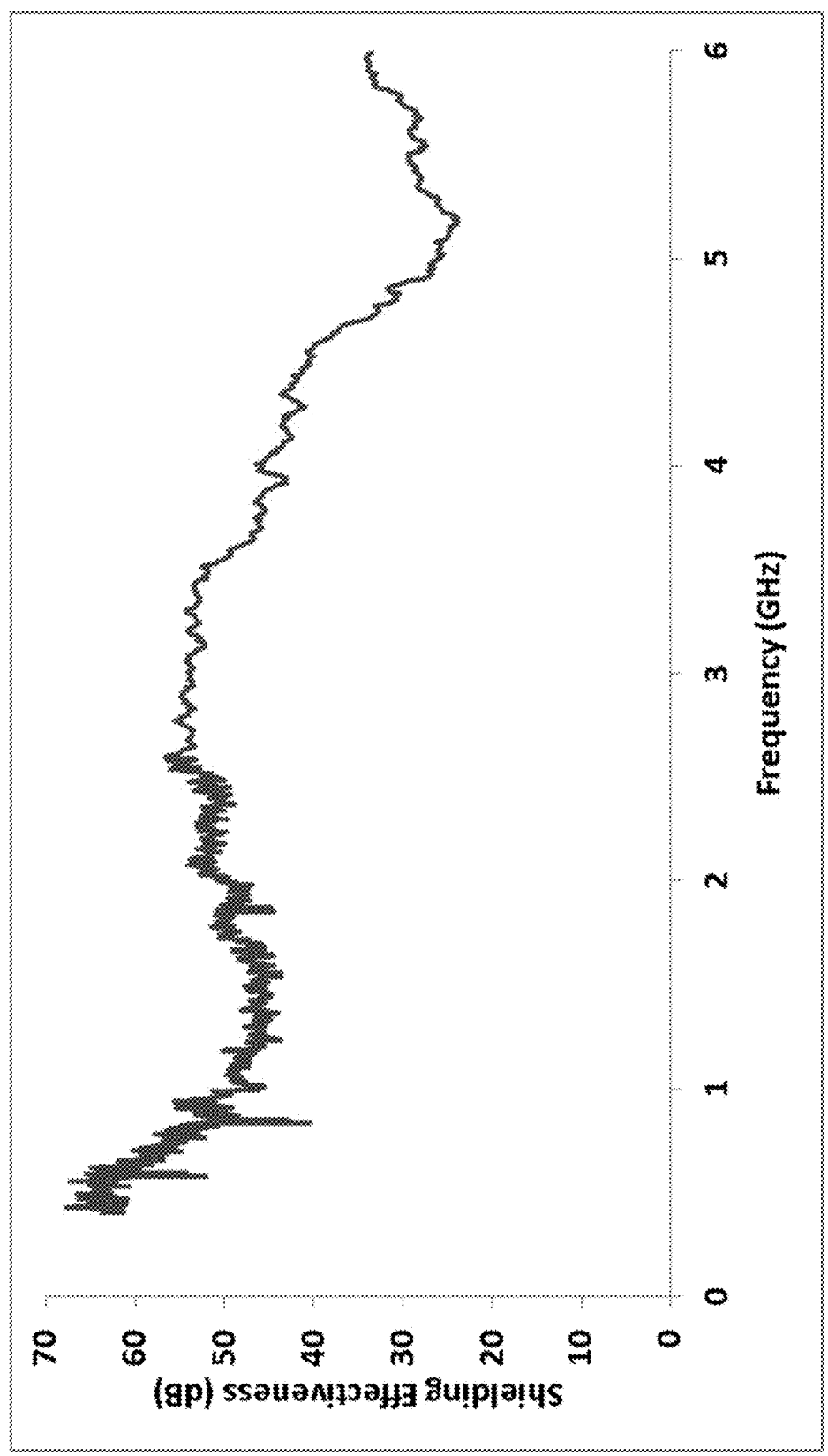
FIG. 11 is a line graph of shielding effectiveness in decibels (dB) versus frequency in gigahertz (GHz) measured for a soldered sample prototype of a SiP multilayer BLS, and showing measured shielding effectiveness greater than 40 dB up to 4 GHz.

FIG. 11 is a line graph of shielding effectiveness in decibels (dB) versus frequency in gigahertz (GHz) measured for a soldered sample prototype of a SiP multilayer BLS, and showing measured shielding effectiveness greater than 40 dB up to 4 GHz. These test results are provided for purpose of illustration only as other exemplary embodiments may be configured different and have different shielding effectiveness (e.g., greater than or less than 40 dB, etc.).

In some exemplary embodiments, at least a portion (e.g., the electrically-conductive shielding layer, inner and/or outer dielectric layers, etc.) of the multilayer thin film BLS may be thermally conductive to help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc.

For example, the electrically-conductive shielding layer may be thermally conductive, and the dielectric layer(s) may be thin enough to allow sufficient heat transfer therethrough for thermal management. Or, for example, a portion of the multilayer thin film BLS may be removed and replaced with one or more thermal interface materials (e.g., compliant or conformable thermal interface pad, putty, or gap filler, etc.). The one or more thermal interface materials may be configured to make contact (e.g., direct physical contact, etc.) with a heat dissipating device or heat removal structure.

In exemplary embodiments, one or more thermal interface materials may be positioned directly against and/or in thermal contact (e.g., adhesively attached via a PSA tape, etc.) with one more portions of the shielding layer. For example, one or more thermal interface material may be positioned at one or more locations along the shielding layer whereat the dielectric layer was not applied. As another example, one or more thermal interface materials may be applied at one or more locations along the shielding layer from which one or more portions of the dielectric layer has been removed to thereby expose the underlying portion(s) of the shielding layer that was previously covered by the dielectric layer. By way of further example, a thermal interface material may be naturally tacky and be able to self-adhere on its own to the shielding layer. Or, for example, the thermal interface material may be pattern coated onto a master roll and/or may be cured directly onto a foil for reduced contact resistance and better adhesion improving thermal performance. A graphite sheet may also or instead be used as a TIM/heat spreader, which may be enclosed in plastic (or other dielectric) or not.

Example thermal interface materials that may be used in exemplary embodiments include thermal gap fillers, thermal phase change materials, thermally-conductive EMI absorbers or hybrid thermal/EMI absorbers, thermal greases, thermal pastes, thermal putties, dispensable thermal interface materials, thermal pads, etc. In addition to, or instead of, thermal interface materials, exemplary embodiments may include one or more EMI absorbers, such as NoiseSorb NS1000 series ultrathin nearfield noise suppression absorber from Laird, etc.

Example embodiments may include one or more thermal interface materials of Laird, such as any one or more of the Tputty™ 502 series thermal gap fillers, Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, Tpcm™ 780 series phase change materials, Tpcm™ 900 series phase change materials etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc. In some exemplary embodiments, the thermal interface material may comprise compliant gap filler having high thermal conductivity. By way of example, the thermal interface material may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800 thermal gap fillers.

The thermal interface materials disclosed herein may comprise an elastomer and/or ceramic particles, metal particles, ferrite EMI/RFI absorbing particles, metal or fiberglass meshes in a base of rubber, gel, or wax, etc. The thermal interface materials may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The thermal interface materials may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface.

The thermal interface materials disclosed herein may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the first and/or second thermal interface materials may include ceramic filled silicone elastomer, boron nitride filled silicone elastomer, or a thermal phase change material that includes a generally non-reinforced film.

Exemplary embodiments may include one or more thermal interface materials having a high thermal conductivity (e.g., 0.5 W/mK (watts per meter per Kelvin), 1 W/mK, 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 0.5 W/mK, or other values between 0.5 and 6 W/mk. Accordingly, aspects of the present disclosure should not be limited to use with any particular thermal interface material as exemplary embodiments may include a wide range of thermal interface materials.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A multilayer board level shield comprising an electrically-conductive shielding layer disposed between inner and outer dielectric layers, wherein the multilayer board level shield has an overall thickness of about 25 microns or less, and wherein the multilayer board level shield has sufficient flexibility to be reconfigurable generally over one or more components on a substrate to thereby provide board level shielding for the one or more components, wherein:
   the electrically-conductive shielding layer comprises an electrically-conductive foil between the inner and outer dielectric layers;
   the electrically-conductive foil is electrically coupled directly to one or more ground traces of the printed circuit board without requiring any bond pads and without requiring a board level shield fence or frame; and
   one or more dielectric joints are defined between the printed circuit board and the outer dielectric layer that attach the multilayer board level shield to the printed circuit board.

2. The multilayer board level shield of claim 1, wherein:
   the inner dielectric layer comprises an inner dielectric polymer film;
   the outer dielectric layer comprises an outer dielectric polymer film; and
   the electrically-conductive shielding layer is between the inner and outer dielectric polymer films.

3. The multilayer board level shield of claim 1, wherein:
   the inner and outer dielectric layers comprise dielectric material; and
   the electrically-conductive foil comprises a metal foil having an inner surface coated with the dielectric material defining the inner dielectric layer, and an outer surface coated with the dielectric material defining the outer dielectric layer.

4. The multilayer board level shield of claim 1, wherein the multilayer board level shield comprises a laminated structure that includes the electrically-conductive shielding layer disposed between the inner and outer dielectric layers and that is roll stock on a roll.

5. The multilayer board level shield of claim 1, wherein:
   the electrically-conductive shielding layer comprises a sheet of the electrically-conductive foil disposed between the inner and outer dielectric layers, such that the multilayer board level shield has a flat sheet configuration defined by the sheet of electrically-conductive foil disposed between the inner and outer dielectric layers; and
   the multilayer board level shield including the sheet of electrically-conductive foil disposed between the inner and outer dielectric layers have sufficient flexibility to be reconfigurable from the flat sheet configuration to a non-flat configuration generally over and around the one or more components on the substrate.

6. The multilayer board level shield of claim 1, wherein:
   the multilayer board level shield has an overall thickness of about 15 microns or less; and
   the multilayer board level shield comprises a laminated structure including the electrically-conductive shielding layer disposed between the inner and outer dielectric layers on a roll.

7. The multilayer board level shield of claim 1, wherein:
the multilayer board level shield has an overall thickness of about 15 microns or less;
the multilayer board level shield has a flat sheet configuration defined by the electrically-conductive shielding layer disposed between the inner and outer dielectric layers; and
the multilayer board level shield including the electrically-shielding layer disposed between the inner and outer dielectric layers in the flat sheet configuration are flexible, deformable, or bendable to a non-flat configuration generally over and around the one or more components on the substrate.

8. The multilayer board level shield of claim 1, wherein the one or more dielectric joints comprise one or more laser or sonic dielectric welds defined by integral dielectric portions of the outer dielectric layer that couple the outer dielectric layer to the substrate such that the electrically-conductive shielding layer electrically contacts a ground of the substrate.

9. The multilayer board level shield of claim 1, wherein the electrically-conductive shielding layer further comprises a metal coating on either or both of the inner and outer dielectric layers, the metal coating having a minimum thickness of at least about 10 microns or more to provide a shielding effectiveness of at least 40 decibels or more from about 50 megahertz to about 6 gigahertz.

10. A system in package comprising a multilayer board level shield according to claim 1, and a printed circuit board having a ground and one or more components, the multilayer board level shield including the electrically-conductive shielding layer disposed between the inner and outer dielectric layers, wherein the electrically-conductive shielding is electrically coupled to the ground, and wherein the multilayer board level shield is draped, flexed, or wrapped generally over the one or more components of the printed circuit to thereby provide board level shielding for the one or more components with a shielding effectiveness greater than 40 decibels up to 4 gigahertz.

11. A method of applying board level shielding to one or more components on a substrate, the method comprising:
positioning a multilayer board level shield according to claim 1 generally over the one or more components on the substrate, wherein the multilayer board level shield comprises the electrically-conductive shielding layer disposed between the inner and outer dielectric layers; and
electrically coupling the electrically-conductive shielding layer to a ground of the substrate.

12. The multilayer board level shield of claim 1, wherein the electrically-conductive shielding layer is electrically coupled to a ground of a printed circuit board of a system in package, and wherein the multilayer board level shield is draped, flexed, or wrapped generally over one or more components of the printed circuit to thereby provide board level shielding for the one or more components with a shielding effectiveness greater than 40 decibels up to 4 gigahertz.

13. The multilayer board level shield of claim 12, wherein the one or more dielectric joints comprise one or more laser or sonic dielectric welds defined by integral dielectric portions of the outer dielectric layer and coupling the outer dielectric layer to the printed circuit board such that the electrically-conductive shielding layer electrically contacts the ground of the printed circuit board without using any bond pads or a board level shield fence.

14. The multilayer board level shield of claim 1, wherein:
the inner and outer dielectric layers comprise inner and outer dielectric thermoplastic layers; and
the electrically-conductive foil is between the inner and outer dielectric thermoplastic layers.

15. The multilayer board level shield of claim 1, wherein the electrically-conductive shielding layer and the inner and outer dielectric layers are configured such that the multilayer board level shield, including the electrically-conductive shielding layer and the inner and outer dielectric layers, have sufficient flexibility to be deformed, flexed, bent, draped, or wrapped from a flat sheet configuration to a non-flat configuration over and around the one or more components on the substrate, whereby:
one or more portions of the electrically-conductive layer are positionable directly against and in electrical contact with a ground on the substrate; and
one or more portions of the inner dielectric layer are positionable directly against an upper surface of the one or more components to thereby eliminate any gap between the upper surface of the one or more components and the one or more portions of the inner dielectric layer.

16. The multilayer board level shield of claim 1, wherein the one or more dielectric joints are defined by or include one or more integral dielectric portions of the outer dielectric layer that adhesively bond the outer dielectric layer to the substrate, wherein the one or more integral dielectric portions of the outer dielectric layer comprise one or more melted and then solidified portions of the outer dielectric layer.

17. The multilayer board level shield of claim 1, wherein the one or more dielectric joints comprise one or more integral dielectric portions of the outer dielectric layer coupling the outer dielectric layer to the substrate such that the electrically-conductive shielding layer electrically contacts a ground of the substrate without using any bond pads or a board level shield fence.

18. A multilayer board level shield comprising an electrically-conductive shielding layer disposed between inner and outer dielectric layers, wherein the multilayer board level shield has an overall thickness of about 25 microns or less, and wherein the multilayer board level shield has sufficient flexibility to be reconfigurable generally over one or more components on a substrate to thereby provide board level shielding for the one or more components, wherein:
the electrically-conductive shielding layer is electrically coupled to a ground of a printed circuit board of a system in package, and wherein the multilayer board level shield is draped, flexed, or wrapped generally over one or more components of the printed circuit to thereby provide board level shielding for the one or more components with a shielding effectiveness greater than 40 decibels up to 4 gigahertz;
the inner and outer dielectric layers comprise inner and outer dielectric thermoplastic layers;
the electrically-conductive shielding layer comprises an electrically-conductive foil between the inner and outer dielectric thermoplastic layers;
the electrically-conductive foil is electrically coupled directly to one or more ground traces of the printed circuit board without requiring any bond pads and without requiring a board level shield fence or frame; and
one or more dielectric joints are defined between the printed circuit board and the outer dielectric thermoplastic layer that attach the multilayer board level shield to the printed circuit board.

19. The multilayer board level shield of claim 18, wherein the one or more dielectric joints are defined by or include one or more integral dielectric portions of the outer dielectric thermoplastic layer adhesively bonding the outer dielectric thermoplastic layer to the printed circuit board.

20. The multilayer board level shield of claim 19, wherein the one or more integral dielectric portions of the outer dielectric thermoplastic layer comprise one or more melted and then solidified portions of the outer dielectric thermoplastic layer.

* * * * *